United States Patent [19]

Mott

[11] 4,431,985
[45] Feb. 14, 1984

[54] STEPPER MOTOR SYSTEM FOR DIGITALLY MEASURING INPUT QUANTITIES

[75] Inventor: Richard C. Mott, Harwood Heights, Ill.

[73] Assignee: Honeywell Inc., Minneapolis, Minn.

[21] Appl. No.: 239,844

[22] Filed: Mar. 2, 1981

[51] Int. Cl.³ .......................................... H03K 13/02
[52] U.S. Cl. .............................. 340/347 AD; 73/701; 73/723; 318/687; 340/347 M; 377/17
[58] Field of Search .................. 73/701, 723, 753; 318/696, 39, 135, 687; 377/17

[56] References Cited

U.S. PATENT DOCUMENTS

| | | |
|---|---|---|
| 3,453,510 | 7/1969 | Kreuter et al. . |
| 3,548,164 | 12/1970 | Hall . |
| 3,739,645 | 6/1973 | Gorgens et al. . |
| 3,832,618 | 8/1974 | Levesque et al. ................ 73/701 X |
| 3,845,348 | 10/1974 | Riley . |
| 3,908,460 | 9/1975 | Lichowsky . |
| 3,937,912 | 2/1976 | Martin .............................. 200/82 C |
| 3,962,619 | 6/1976 | Nishimura et al. ............... 318/39 X |
| 4,314,146 | 2/1982 | Berney ............................ 318/696 X |

Primary Examiner—T. J. Sloyan
Attorney, Agent, or Firm—Trevor B. Joike

[57] ABSTRACT

A digital system for measuring an input quantity includes an input mechanism for providing a first input in response to an input quantity to be measured, a stepper motor for providing a second input, a measuring apparatus connected to the input mechanism and to the stepper motor such that the measuring apparatus provides an output when the first and second inputs reach a predetermined relationship, and a circuit connected to the stepper motor and to the measuring apparatus for stepping the stepper motor from a reference position and for counting the steps of the stepper motor until the measuring apparatus provides the output.

29 Claims, 3 Drawing Figures

START
(RESET)
$\overline{CE}$
SE
$\overline{UP}$
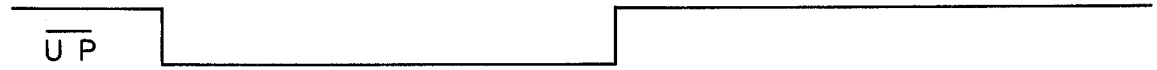
STOP
REF
F I G. 3

STEPPER MOTOR SYSTEM FOR DIGITALLY MEASURING INPUT QUANTITIES

BACKGROUND OF THE INVENTION

The present invention relates to a digital system for measuring an input quantity and, more particularly, to a system using a stepper motor in which the number of steps required by a stepper motor to go from a reference point to a variable point determined by the input quantity are counted to provide a digital representation of the input quantity.

The present invention is, for example, useful in digital communication systems in which an analog sensed value must be converted to a digital value for transmission to a central processing unit or to a data gathering panel for processing thereby. A typical digital communication system is used for controlling the air conditioning systems of buildings. In such air conditioning systems, various analog values such as temperature, humidity and static pressure are measured to indicate the conditions of the spaces or zones controlled by the air conditioning systems. These analog values must be transmitted to a processor so that proper remedial action can be taken if the temperature, humidity or static pressure is not as desired. For example, if the temperature within a room in a building is below setpoint during the winter, the processor, using the analog value of the temperature in the room, will determine that heat must be applied to the room to bring the temperature back up to setpoint. In order for the processor to control temperature, the actual temperature must be communicated to it and it must communicate the appropriate response to the air conditioning equipment controlling that room. Since communication equipment are nearly always digital, the analog value of the temperature must be somehow digitally transmitted to the processor.

A typical prior art system for reading an analgo value and for transmitting a digital representation of that analog value comprises a transducer responsive to the analog value for providing a corresponding analog electrical signal and an analog-to-digital converter responsive to the analog electrical signal for providing the digital output representation. The present invention eliminates the two step process and instead directly converts the analog input quantity into a digital output representation.

SUMMARY OF THE INVENTION

Thus, the present invention relates to a digital system for measuring an input quantity which includes a measuring device responsive to a first force indicative of an input quantity and to a stepper motor which provides a second force, the measuring device providing an output when the first and second forces reach a predetermined relationship with respect to one another, and a circuit connected to the stepper motor and to the measuring device for stepping the stepper motor from a reference position and for counting the steps of the stepper motor until the measuring device provides the output.

Each mesuring operation may be conducted in the same direction thus eliminating hysteresis, backlash and deadband.

BRIEF DESCRIPTION OF THE DRAWINGS

These and other features and advantages will become more apparent from a detailed consideration of the invention when taken in conjunction with the drawings in which:

FIG. 3 shows a timing diagram for the operation of the circuit shown in FIG. 2.

DETAILED DESCRIPTION

Figure 1:
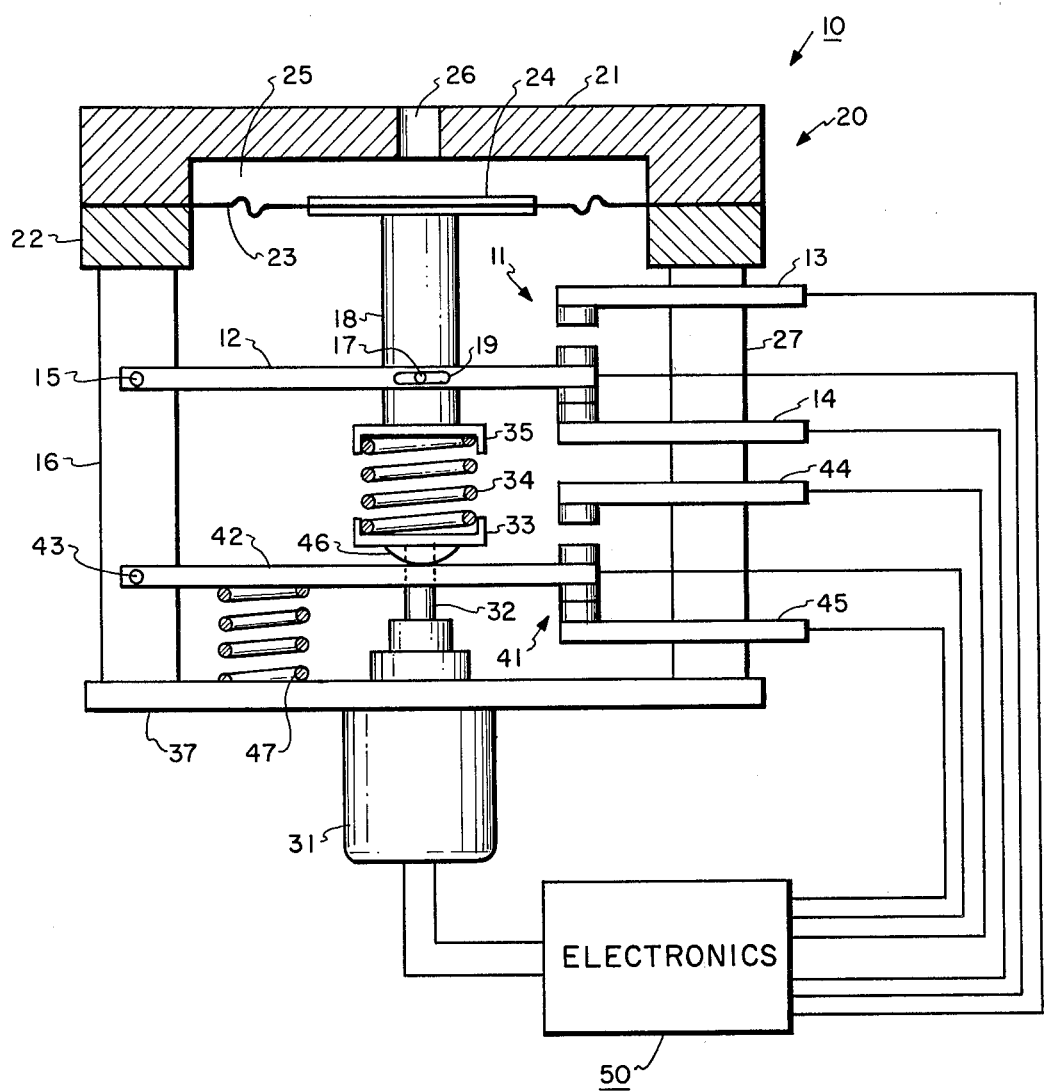
FIG. 1 shows the digital measuring system according to the present invention.

As shown in FIG. 1, digital measuring system 10 is comprised of measuring switch 11 having movable contact 12 operating between stationary contacts 13 and 14. Movable contact 12 is connected to a pivot point comprising pin 15 attaching movable contact 12 to support bar 16. Movable contact 12 has a slot 19 through which extends pin 17 attached to push rod 18. Pin 17 and slot 19 allow movable contact 12 to be rotated about pivot point 15 as push rod 18 is moved up and down.

As shown in FIG. 1, push rod 18 is adapted to be moved by pneumatic motor 20. Pneumatic motor 20 includes housing part 21 separated from housing part 22 by diaphragm 23 all of which are suitably clamped together. Diaphragm 23 has pusher plates 24 attached thereto and suitably attached to push rod 18. Housing part 21 forms input chamber 25 with diaphragm 23. Input chamber 25 receives an input quantity in the form of a pneumatic signal through input port 26. Stationary contacts 13 and 14 may be supported by support bar 27 in a substantially rigid manner. Pneumatic motor 20 applies a first input, in this case a force, to movable contact 12 in response to the pneumatic signal supplied to input chamber 25 through inlet port 26.

Applying a second force against push rod 18, and thereby against movable contact 12, is stepper motor 31 which operates through output shaft 32 attached to disc 33 for exerting a force through spring 34 against disc 35 suitably attached to push rod 18.

Measuring device 11 will provide an output, movable contact 12 moving against stationary contact 13, when the first and second forces reach a predetermined relationship. In the case of the system shown in FIG. 1, this predetermined relationship occurs when the forces are substantially equal but opposite. However, the system can be arranged so that these forces are additive. In this case, the predetermined relationship is a fixed value to which the first and second forces must add. For example, a spring may bias movable contact 12 against stationary contact 14 with sufficient force that, without a first force being applied to movable contact 12, stepper motor 31 must fully outstroke before movable contact 12 is disengaged from stationary contact 14. However, when a first force representing an input quantity is applied to movable contact 12 in the same direction as the second force applied by stepper motor 31, the first and second forces will add and act against the third force applied by the spring. The number of steps required of the stepper motor 31 to apply a force which when added to the first force breaks contact between movable contact 12 and stationary contact 14 is then indicative of the first force. However, as shown in FIG. 1, the preferred embodiment is one in which the first force applied to movable contact 12 in response to the input quantity acts oppositely to the second force applied to the movable contact 12 by stepper motor 31.

Moreover, pneumatic motor 20 is useful when the system is designed for providing a digital readout of a pneumatic thermostat, pneumatic humidistat, pneumatic static pressure sensor or similar pneumatic devices. Should the invention be used to directly measure an input other than force, such as the movement or position of a valve stem or of a blade of a damper, the device for which movement is to be digitally measured can be connected directly to movable contact 12. Thus, if a valve stem or damper blade is to be measured, the valve stem or damper blade can be directly connected to movable contact 12 so that a digital measurement of the amount of movement of the damper blade or valve stem can be measured.

Stepper motor 31 is suitably supported to plate 37, and plate 37 and support bars 16 and 27 may be suitably attached to pneumatic motor 20.

In order for system 10 to accurately measure a new input quantity, a reference position of stepper motor 31 must be known. That is, when a new input quantity is received by the digital measuring system 10, the stepper motor will be energized from the reference position by a number of steps sufficient so that the second force applied by it to the measuring switch will counteract the first force applied to the measuring switch by the input quantity. Since the reference position is known, the number of steps can be counted to provide an indication of the first force applied to the measuring switch.

The reference position can be the prior position to which stepper motor 31 was driven in the previous measuring cycle. This operation implies that if the new input quantity to be measured is greater than the old input quantity, stepper motor 31 will be outstroked from the position indicative of a previous input quantity to a position indicative of the new input quantity. Since the previous input quantity was known and since the difference between the previous input quantity and the new input quantity is given by the number of additional steps in the new measuring cycle, the new input quantity can be determined. If the input quantity, however, is smaller than the previous input quantity, then stepper motor 31 must be backstroked until the forces acting upon the measuring switch again balance. Again, since the previous input quantity is known and since the number of steps in the backstroke occurring during the new measuring cycle is also known, the new input quantity can be determined. However, this counting arrangement is bidirectional and is, therefore, subject to hysteresis, backlash, dead zones and the like.

Thus, the peferred embodiment as shown in FIG. 1 relies upon reference switch 41 to provide the reference position. Each new measuring cycle is initiated from the reference position as fixed by reference switch 41.

Reference switch 41 comprises movable contact 42 which is pivoted around pin 43 attached between it and support bar 16. Movable contact 42 operates between stationary contacts 44 and 45. Disc 33 has knob 46 depending therefrom which abuts movable contact 42 and movable contact 42 is biased against knob 46 by spring 47. Reference switch 41 insures that each new measuring cycle will be initiated from a fixed reference position and that within the measuring cycle the stepper motor 31 is always driven in the same direction.

Figure 2:
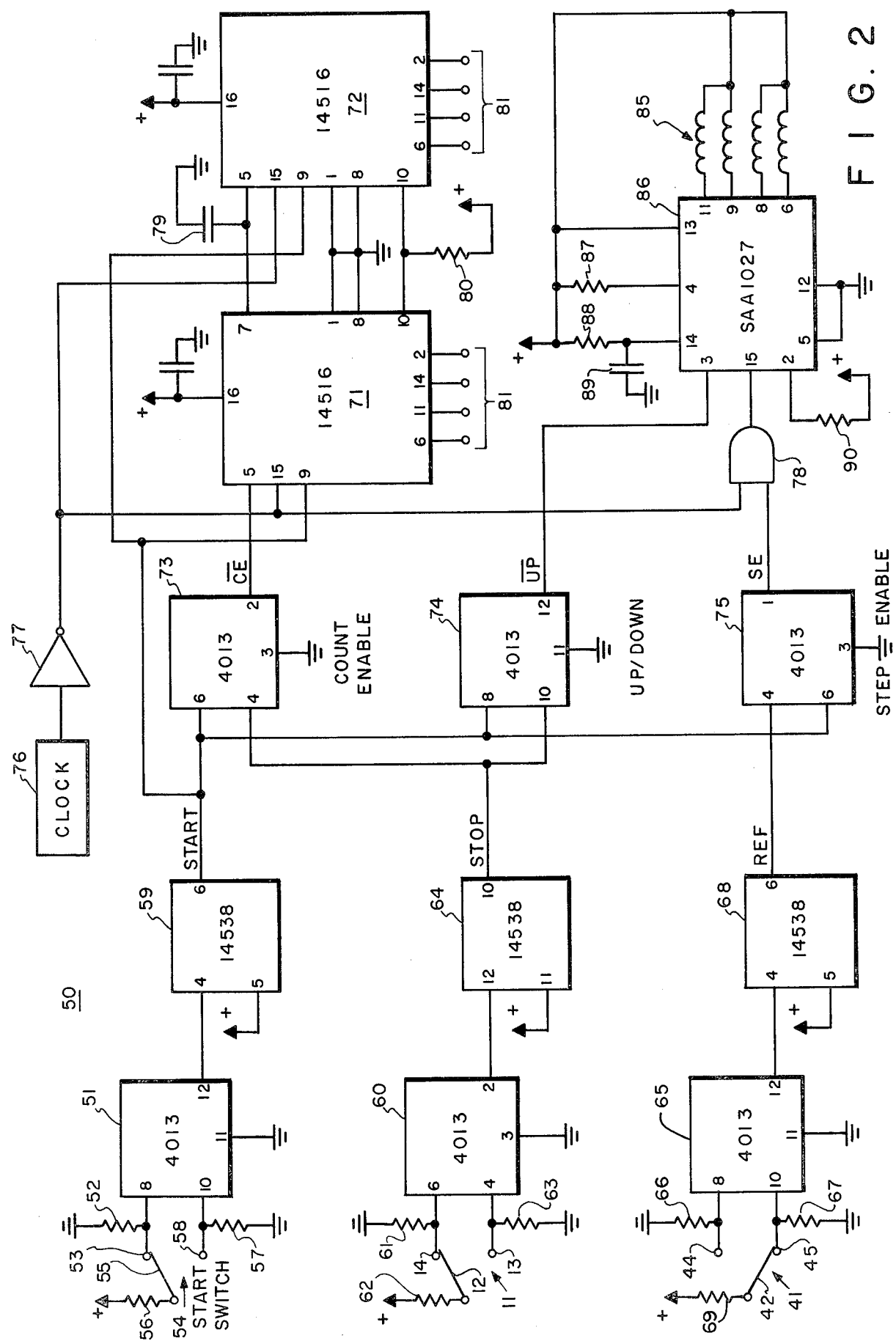
FIG. 2 shows in more detail the electronics shown in FIG. 1.

Contacts 12, 13, 14, 42, 44 and 45 are all connected as inputs to electronic circuit 50 which controls the stepping of stepper motor 31. Electronic circuit 50 is shown in more detail in FIG. 2. In FIG. 2, bistable latch 51 has pin 8 connected to ground through resistance 52 and to stationary contact 53 of start switch 54. Movable contact 55 of start switch 54 is connected through resistance 56 to a positive source. Pin 10 of latch 51 is connected to ground through resistance 57 and to stationary contact 58 of switch 54. Output pin 12 of latch 51 is connected through monostable multivibrator 59 to provide the start signal shown in FIG. 3.

Start switch 54 is used to initiate the measuring cycle. This start switch may be replaced by a suitable circuit responsive to a digital input signal when electronic circuit 50 is included in a digital communication system.

Bistable latch 60 has its pin 6 connected to ground through resistance 61 and to stationary contact 14 of measuring switch 11. Movable contact 12 is connected to a positive source through resistance 62. Pin 4 of bistable latch 60 is connected to ground through resistance 63 and to stationary contact 13. Output pin 2 of bistable latch 60 is connected through monostable multivibrator 64 to provide the stop signal as shown in FIG. 3.

Bistable latch 65 has its pin 8 connected to ground through resistance 66 and to stationary contact 44 of reference switch 41. Pin 10 of bistable latch 65 is connected to ground through resistance 67 to stationary contact 45. Movable contact 42 is connected to a positive source through resistance 69. Output pin 12 of bistable latch 65 is connected to monostable multivibrator 68 to provide the reference signal REF shown in FIG. 3.

The output of monostable multivibrator 59 is connected to pins 9 of counters 71 and 72 for resetting these counters to 0 at the start of a new measuring cycle. The output of multivibrator 59 is also connected to pin 6 of bistable latch 73 to provide the count enable pulse $\overline{CE}$ at output pin 2 thereof. The output of monostable multivibrator 59 is also connected to pin 8 of bistable latch 74 for providing the up/down signal $\overline{UP}$ at pin 12 thereof. Finally, multivibrator 59 is connected to pin 6 of bistable latch 75 for providing the step enable output SE at pin 1 thereof.

The output of monostable multivibrator 64 is connected to pins 4 and 10 of bistable latches 73 and 74 thereof to reset these latches. Monostable multivibrator 68 is connected to pin 4 of bistable latch 75 for resetting it.

Clock 76 provides pulses through inverter 77 to input pins 15 of counters 71 and 72 and to an input of AND gate 78. Pin 2 of bistable latch 73 is connected to pin 5 of counter 71, and pin 7 of counter 71 is connected to pin 5 of counter 72 and to ground through capacitor 79. Pins 1 and 8 of counters 71 and 72 are connected to ground and pins 10 are connected to a positive source through resistance 80. Output pins 6, 11, 14 and 2 of both counters 71 and 72 provide the output count at 81 which is indicative of the input quantity.

Windings 85 of stepper motor 31 are shown controlled by pins 11, 9, 8 and 6 of circuit 86. Circuit 86 receives clock pulses at pin 15 from AND gate 78. Pin 3 of circuit 86 controls the direction of movement of stepper motor 31, i.e. backstroke or outstroke. Pin 13 is connected directly to a positve source and pins 4 and 14 are connected to the positive source through respective resistors 87 and 88. Pin 14 is also tied to ground through capacitor 89. Pin 2 is tied to the positive source through resistor 90 and pins 5 and 12 are grounded.

Digital measuring system 10 is arranged to digitally measure an analog value. For example, when temperature is sensed by a pneumatic thermostat, the pneumatic output signal from the thermostat is connected to pneumatic motor 20 such that the pressure within chamber 25 has an analog value representing the temperature sensed by the thermostat. This pressure within chamber 25 exerts a force on diaphragm 23 and push rod 18. By operating stepper motor 31 until the force exerted by it matches the force exerted on it by the pressure within chamber 25, the analog value of the input quantity can be measured.

In operation, each measuring cycle is initiated by depressing movable contact 55 of start switch 54 until it contacts stationary contact 58. Bistable latch 51 is thereby switched for triggering monostable multivibrator 59 to supply the START pulse as shown in FIG. 3. When movable contact 55 of start switch 54 is released, movable contact 55 again contacts stationary contact 53 for resetting bistable latch 51. As is well known, however, the resetting of bistable latch 51 will not affect the operation of monostable multivibrator 59.

The START pulse is used for resetting output 81 from counters 71 and 72 to 0 and for switching bistable latches 73, 74 and 75. When bistable latch 73 is switched, it provides the output pulse $\overline{CE}$ which enables counter 71 to begin counting clock pulses from clock 76. When bistable latch 74 switches, the $\overline{UP}$ output from up/down latch 74 goes low which conditions stepper motor 31 to outstroke, i.e. to apply an upward force against movable contact 12 of measuring switch 11. When bistable latch 75 switches, it provides the SE pulse which enables AND gate 78 to pass clock pulses to circuit 86 for stepping stepper motor 31. Thus, simultaneously, counters 71 and 72 are reset, they are enabled to count clock pulses, stepper motor 31 is conditioned for outstroking and AND gate 78 is enabled to pass clock pulses to control circuit 86.

Thus, each pulse applied to control circuit 86 for stepping stepper motor 31 out is counted by counters 71 and 72. Stepper motor 31 moves disc 33 towards disc 35 thereby increasing the force on push rod 18. When disc 33 begins moving up, spring 47 will push movable contact 42 to move along with disc 33. Movable contact 42 will thus move away from stationary contact 45 to fixed contact 44 to reset bistable latch 65 to condition it to be switched for providing the reference REF pulse. When the second force applied to push rod 18 by stepper motor 31 just overcomes the first force applied to push rod 18 by the input quantity in chamber 25 of pneumatic motor 20, measuring switch 11 will be activated. Activation of measuring switch 11 moves movable contact 12 against fixed contact 13 to switch bistable latch 60 to trigger monostable multivibrator 64 and thereby provide the STOP pulse as shown in FIG. 3. The STOP pulse resets bistable latches 73 and 74 for terminating the $\overline{CE}$ and $\overline{UP}$ pulses. When signal $\overline{CE}$ goes high, counters 71 and 72 are no longer enabled to count clock pulses. When $\overline{UP}$ goes high, circuit 86 is conditioned for causing stepper motor 31 to backstroke.

When bistable latch 74 is switched to condition stepper motor 31 to backstroke, SE remains high to maintain the enabling of AND gate 78 to pass clock pulses to control circuit 86. Therefore, control circuit 86 continues to receive clock pulses, but because $\overline{UP}$ is now high, stepper motor 31 is now backstroked. Stepper motor 31 will backstroke until movable contact 42 again contacts stationary contact 45. When movable contact 42 contacts stationary contact 45, bistable latch 65 will switch to energize monostable multivibrator 68 for providing the reference pulse REF as shown in FIG. 3. This reference pulse will then reset bistable latch 75 for driving SE low for disabling AND gate 78. When AND gate 78 is disabled, clock pulses are no longer supplied to control circuit 86 and stepping of stepper motor 31 is terminated.

Therefore, the count which exists at terminals 81 of counters 71 and 72 is indicative of the force required to counter-balance the force applied to push rod 18 by the input quantity supplied to input chamber 25 by input port 26. Because this second force is indicative of the first force, and because the first force is indicative of the input quantity, this count is indicative of the input quantity.

The embodiments of the invention in which an exclusive property or right is claimed are defined as follows:

1. A digital system for measuring an input quantity comprising:
   input means for providing a first force in response to an input quantity to be measured;
   stepper motor means for providing a second force;
   measuring means connected to said input means and to said stepper motor means and responsive to said first and second forces such that said measuring means provides an output when said first and second forces reach a predetermined relationship; and,
   control means connected to said stepper motor means and to said measuring means for causing said stepper motor means to step from a reference position and for counting the steps of said stepper motor means until said measuring means provides said output.

2. The system of claim 1 wherein said control means comprises reference means for establishing said reference position, said reference position being fixed and establishing a limit of travel for said stepper motor means such that said counting is done only when said stepper motor means is stepped in a first predetermined direction.

3. The system of claim 2 wherein said reference means comprises a switch which is actuated when said stepper motor means is at said limit.

4. The system of claim 3 wherein said measuring means comprises a switch which is actuated when said first and second forces reach said predetermined relationship.

5. The system of claim 4 wherein said control means comprises a counter.

6. The system of claim 5 wherein said control means comprises start means for resetting said counter and count enable means responsive to said start means for enabling said counter to count pulses from a clock source.

7. The system of claim 6 wherein said control means comprises up/down means responsive to said start means for conditioning said stepper motor means to apply said second force to said measuring means and responsive to said measuring means for conditioning said stepper motor means to be stepped back to said reference position.

8. The system of claim 7 wherein said control means comprises step enable means responsive to said start means for supplying pulses to said stepper motor means from said clock source and responsive to said reference means switch for terminating the supply of pulses to said stepper motor means when said stepper motor means is backstroked to its reference position.

9. The system of claim 8 wherein said input means comprises a pneumatic motor for exerting said first force on said measuring means in response to an input pneumatic signal.

10. The system of claim 1 wherein said measuring means comprises a switch which is actuated when said first and second forces reach said predetermined relationship.

11. The system of claim 10 wherein said control means comprises a counter.

12. The system of claim 11 wherein said control means comprises start means for resetting said counter and count enable means responsive to said start means for enabling said counter to count pulses from a clock source.

13. The system of claim 12 wherein said control means comprises up/down means responsive to said start means for conditioning said stepper motor means to apply said second force to said measuring means and responsive to said measuring means for conditioning said stepper motor means to be stepped back to said reference position.

14. The system of claim 13 wherein said control means comprises step enable means responsive to said start means for supplying pulses to said stepper motor means from said clock source and responsive to said stepper motor means being stepped back to said reference position for terminating the supply of pulses to said stepper motor means.

15. The system of claim 14 wherein said input means comprises a pneumatic motor for exerting said first force on said measuring means in response to an input pneumatic signal.

16. The system of claim 1 wherein said input means comprises a pneumatic motor for exerting a force as said first input on said measuring means in response to an input pneumatic signal.

17. The system of claim 16 wherein said control means comprises a counter.

18. The system of claim 17 wherein said control means comprises start means for resetting said counter and count enable means responsive to said start means for enabling said counter to count pulses from a clock source.

19. The system of claim 18 wherein said control means comprises up/down means responsive to said start means for conditioning said stepper motor means to apply said second force to said measuring means and responsive to said measuring means for conditioning said stepper motor means to be stepped back to said reference position.

20. The system of claim 19 wherein said control means comprises step enable means responsive to said start means for supplying pulses to said stepper motor means from said clock source and responsive to said stepper motor means being stepped back to said reference position for terminating the supply of pulses to said stepper motor means.

21. The system of claim 1 wherein said control means comprises a counter.

22. The system of claim 21 wherein said control means comprises start means for resetting said counter and count enable means responsive to said start means for enabling said counter to count pulses from a clock source.

23. The system of claim 22 wherein said control means comprises up/down means responsive to said start means for conditioning said stepper motor means to apply said second force to said measuring means and responsive to said measuring means for conditioning said stepper motor means to be stepped back to said reference position.

24. The system of claim 23 wherein said control means comprises step enable means responsive to said start means for supplying pulses to said stepper motor means from said clock source and responsive to said stepper motor means being stepped back to said reference position for terminating the supply of pulses to said stepper motor means.

25. A digital system for measuring an input quantity comprising:
    input means for providing a first force in response to an input quantity to be measured;
    stepper motor means for providing a second force, said second force being opposed to said first force;
    measuring means connected to said input means and to said stepper motor means and having a measuring switch which is operated when said second force overcomes said first force;
    reference means for establishing a reference position from which said stepper motor is to be stepped at the beginning of each measuring cycle, said reference means including a reference switch which is operated when said stepper motor is returned to said reference position; and,
    control means connected to said measuring means, to said reference means and to said stepper motor means for initiating said measuring cycle by stepping said stepper motor from said reference position until said measuring switch is operated, for counting the number of steps required to step said stepper motor from said reference position to said position where said measuring switch is operated, and for returning said stepper motor to said reference position where said reference switch is operated.

26. The system of claim 25 wherein said control means comprises a counter.

27. The system of claim 26 wherein said control means comprises start means for resetting said counter and count enable means responsive to said start means for enabling said counter to count pulses from a clock source.

28. The system of claim 27 wherein said control means comprises up/down means responsive to said start means for conditioning said stepper motor means to apply said second force to said measuring means and responsive to said measuring switch for conditioning said stepper motor means to be stepped back to said reference position.

29. The system of claim 28 wherein said control means comprises step enable means responsive to said start means for supplying pulses to said stepper motor means from said clock source and responsive to said reference switch for terminating the supply of pulses to said stepper motor means when said stepper motor means is backstroked to its reference position.

* * * * *